United States Patent
Nien et al.

(10) Patent No.: US 8,729,955 B2
(45) Date of Patent: May 20, 2014

(54) ADAPTIVE THERMAL COMPENSATION CIRCUIT AND METHOD

(75) Inventors: Hung-Shou Nien, Changhua County (TW); Chung-Sheng Cheng, Hsinchu County (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 0 days.

(21) Appl. No.: 13/359,270

(22) Filed: Jan. 26, 2012

(65) Prior Publication Data

US 2012/0194258 A1 Aug. 2, 2012

(30) Foreign Application Priority Data

Jan. 31, 2011 (TW) .............................. 100103604 A

(51) Int. Cl.
*H01L 35/00* (2006.01)

(52) U.S. Cl.
USPC .......................................... 327/513; 323/369

(58) Field of Classification Search
USPC .................................. 327/513; 323/369, 366
See application file for complete search history.

(56) References Cited

U.S. PATENT DOCUMENTS

| | | | |
|---|---|---|---|
| 6,700,365 B2 * | 3/2004 | Isham et al. | 323/317 |
| 6,765,372 B2 * | 7/2004 | Isham | 323/224 |
| 6,996,488 B2 * | 2/2006 | Chu et al. | 702/107 |
| 7,155,133 B2 * | 12/2006 | Stewart et al. | 398/202 |
| 7,274,174 B2 * | 9/2007 | Wang et al. | 323/224 |
| 7,376,359 B2 * | 5/2008 | Tang | 398/202 |
| 7,619,477 B2 * | 11/2009 | Segarra | 330/289 |
| 7,936,540 B2 * | 5/2011 | Isham | 361/18 |
| 8,072,200 B1 * | 12/2011 | Qiu et al. | 323/282 |
| 8,243,407 B2 * | 8/2012 | Fukami | 361/78 |
| 2006/0001408 A1 * | 1/2006 | Southwell et al. | 323/282 |
| 2007/0057160 A1 * | 3/2007 | Kaku et al. | 250/214 R |
| 2008/0125700 A1 * | 5/2008 | Moberg et al. | 604/67 |
| 2009/0161726 A1 * | 6/2009 | Miyamoto et al. | 374/172 |
| 2011/0025292 A1 * | 2/2011 | Huang et al. | 323/318 |
| 2012/0223692 A1 * | 9/2012 | Prodic et al. | 323/283 |

* cited by examiner

*Primary Examiner* — Thomas J Hiltunen

(74) *Attorney, Agent, or Firm* — Muncy, Geissler, Olds & Lowe, P.C.

(57) ABSTRACT

For thermal compensation for an intrinsic element in a system, a circuit and method are proposed to predict the temperature variation caused by power loss of the intrinsic element, in addition to sense the external environment temperature variation of the intrinsic element, and thus sense the operational temperature of the intrinsic element more precisely.

8 Claims, 6 Drawing Sheets

ADAPTIVE THERMAL COMPENSATION CIRCUIT AND METHOD

FIELD OF THE INVENTION

The present invention is related generally to a circuit and method for thermal compensation and, more particularly, to an adaptive thermal compensation circuit and method for an intrinsic element.

BACKGROUND OF THE INVENTION

Sensing an electric parameter such as current and voltage is necessary in most of systems. For example, referring to FIG. 1, a buck power converter 10 uses a pulse width modulation (PWM) controller 12 to switch power MOSFETs M1 and M2 to provide a voltage V0 and a current Io for a load 14, and for regulating the output voltage V0, the buck power converter 10 needs to sense the inductor current IL. An intrinsic lossless current sensing method is popularly used to sense the inductor current IL, which employs the winding resistance of the inductor L or the on-resistance of the power MOSFET M1 or M2 as the current sensor. However, both the winding resistance of an inductor and the on-resistance of a power MOSFET are temperature dependent, and thus the sensed current signal will not be linearly proportional to the inductor current IL, resulting in poor performance at active voltage positioning (AVP) and over current protection (OCP). Since the intrinsic element value, i.e. the winding resistance of the inductor L and the on-resistance of the power MOSFET M1 or M2, varies with temperature, thermal compensation for the intrinsic element is typically employed to improve the accuracy of the sensed current signal. Therefore, it is required an accurate and low-cost method for sensing the temperature of a power component, such as the power MOSFET M1 and M2 and the inductor L shown in FIG. 1.

Generally, a negative temperature coefficient (NTC) thermistor is used to sense the temperature of a power component for thermal compensation. For example, as shown in FIG. 2, an NTC thermistor 16 is placed nearby the inductor L to sense the temperature of the inductor L, and for precise thermal compensation, the NTC thermistor 16 is required to be as close to the inductor L as possible. According to NTC thermal compensation, U.S. Pat. Nos. 6,833,690 and 6,998,827 disclosed two different thermal compensation methods to compensate the environment temperature variation to improve the accuracy of the intrinsic current sensing method and AVP. However, as a system is operating, the intrinsic element value is varied with its operational temperature, mainly caused by the environment temperature and the power loss of the intrinsic element, and unfortunately, the NTC thermistor can not exactly sense the temperature variation caused by the power loss of the intrinsic element. For example, FIG. 3 shows the temperature measurement at the inductor L and the NTC thermistor 16 versus the output current Io in a system as shown in FIG. 1, in which the curve 18 represents the temperature of the inductor L, and the curve 20 represents the temperature of the NTC thermistor 16. As clearly shown in FIG. 3, the NTC thermistor 16 does not exactly sense the operational temperature of the inductor L. While the NTC thermistor 16 can sense the environment temperature outside the inductor L, the power loss of the inductor L can increase the internal temperature of the inductor L and thus makes the internal temperature of the inductor L higher than the external environment temperature. The NTC thermistor 16 only senses the external environment temperature of the inductor L and part of the internal operational temperature of the inductor L. Therefore, the temperature variation caused by the power loss of the intrinsic element is not precisely sensed and compensated by conventional methods.

The inductor L and the power MOSFETs M1 and M2 are all power components, whose power loss causes considerable temperature variation. Therefore, it is desired an improved intrinsic current sensing method.

SUMMARY OF THE INVENTION

An objective of the present invention is to provide an adaptive thermal compensation circuit and method for more precisely sensing the temperature variation of an intrinsic element in a system.

Another objective of the present invention is to provide an adaptive thermal compensation circuit and method for predicting the temperature variation caused by power loss of an intrinsic element in a system.

According to the present invention, an adaptive thermal compensation circuit and method for an intrinsic element in a system predict the temperature variation of the intrinsic element caused by power loss according to the current of the intrinsic element, in addition to sense the variation of the external environment temperature of the intrinsic element, and thus sense the operational temperature of the intrinsic element more precisely, thereby accomplishing better thermal compensation.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
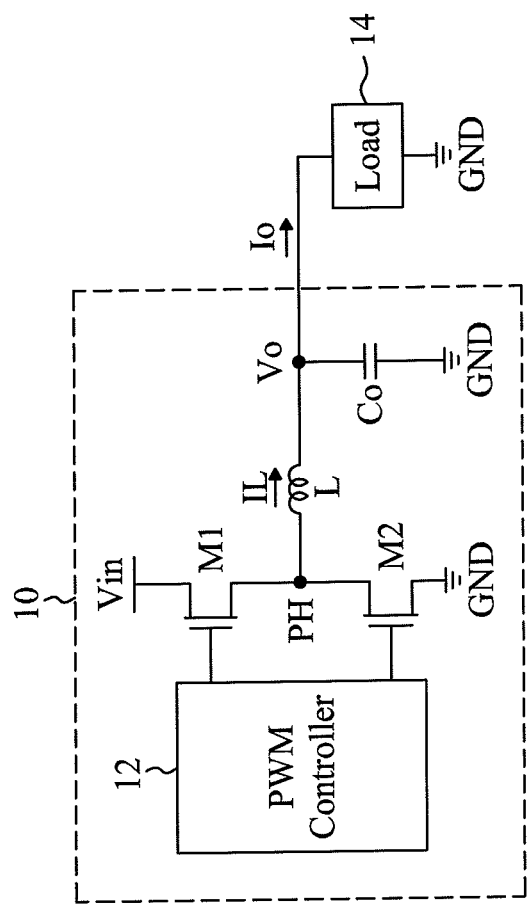
FIG. 1 is a circuit diagram of a buck power converter.
Figure 3:
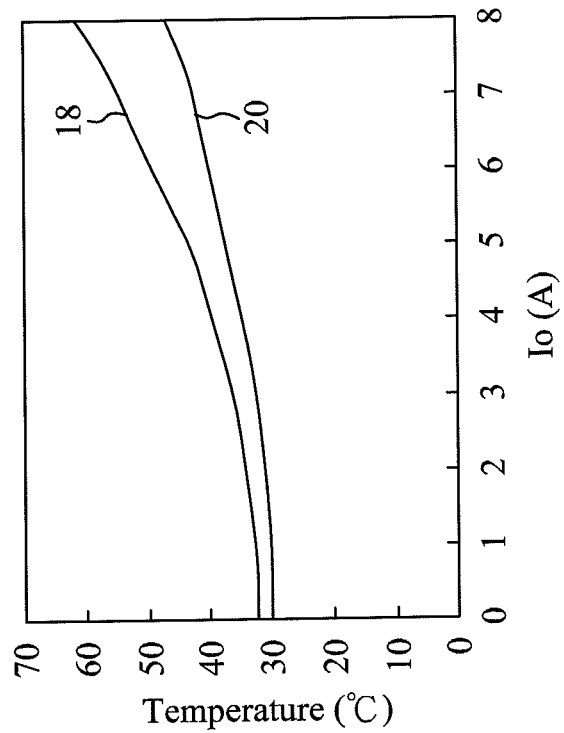
FIG. 3 is a diagram showing the temperature measurement at the inductor and an NTC thermistor versus the output current in a system as shown in FIG. 1.
Figure 2:
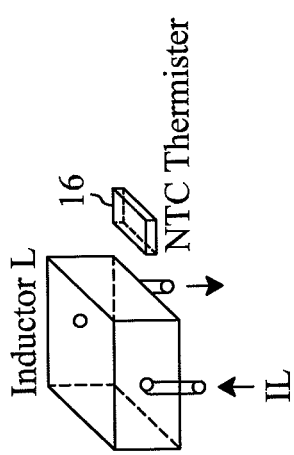
FIG. 2 is a diagram of an arrangement for NTC thermal compensation.
Figure 4:
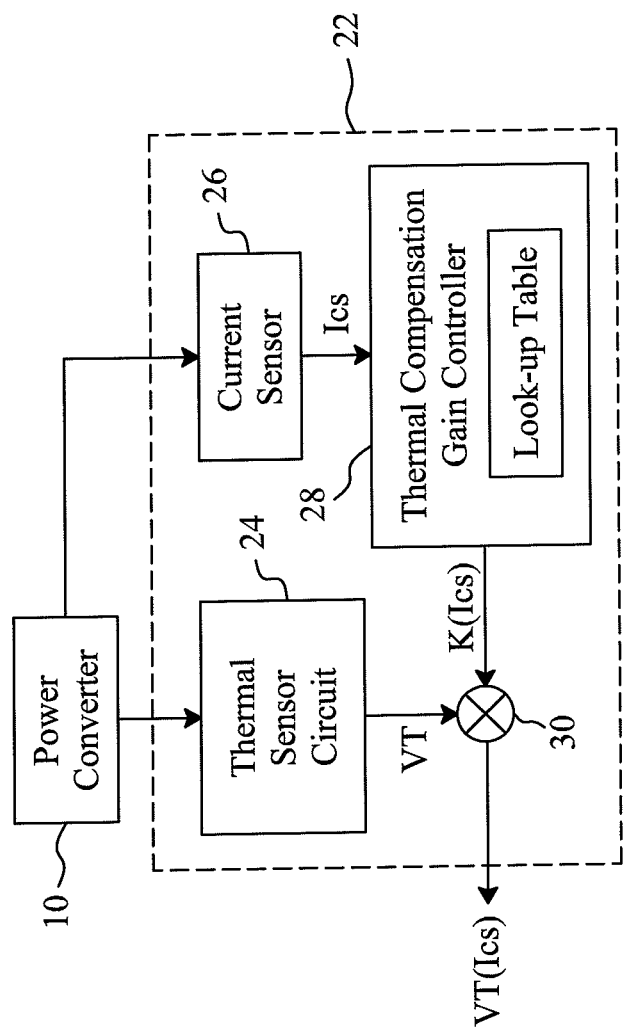
FIG. 4 is a block diagram of an embodiment according to the present invention for thermal compensation of an intrinsic element.

Referring to FIG. 4 for an embodiment according to the present invention, an adaptive thermal compensation circuit 22 senses the temperature of an intrinsic element in a power converter 10 to generate a precise adaptive sensed temperature value VT(Ics) for thermal compensation or temperature determination. The adaptive thermal compensation circuit 22 includes a thermal sensor circuit 24 to sense the external environment temperature of the intrinsic element to generate a sensed external environment temperature value VT, a current sensor 26 to sense the current of the intrinsic element to generate a current sense signal Ics, a thermal compensation gain controller 28 to determine a thermal compensation value K(Ics) according to the current sense signal Ics, and an operation circuit 30 to generate the adaptive sensed temperature value VT(Ics) according to the sensed external environment temperature value VT and the thermal compensation value K(Ics). In determination of the thermal compensation value K(Ics), the thermal compensation gain controller 28 predicts the internal temperature variation of the intrinsic element caused by power loss according to the current sense signal Ics. The thermal sensor circuit 24 may includes an NTC thermistor, as conventional methods did, and the current sensor 26 may be the winding resistance of the inductor, the on-resistance of a power MOSFET or the phase voltage of the power converter 10, as typically used in a power converter. The thermal compensation gain controller 28 may be implemented by any available hardware, software or firmware, for example, a look-up table derived from the measurement shown in FIG. 3, so that the thermal compensation gain controller 28 can search the look-up table according to the current sense signal Ics to determine a corresponding thermal compensation value K(Ics). Alternatively, the measurement shown in FIG. 3 may be used to design an equation, so that the thermal compensation gain controller 28 may perform calculation with the current sense signal Ics to generate a corresponding thermal compensation value K(Ics).

Since the adaptive thermal compensation circuit 22 can predict the internal temperature variation of the intrinsic element caused by power loss, it can sense the temperature variation more precisely and increase the accuracy of the intrinsic current sensing method, thereby improving the performance of AVP and increasing the accuracy of OCP.

Figure 5:
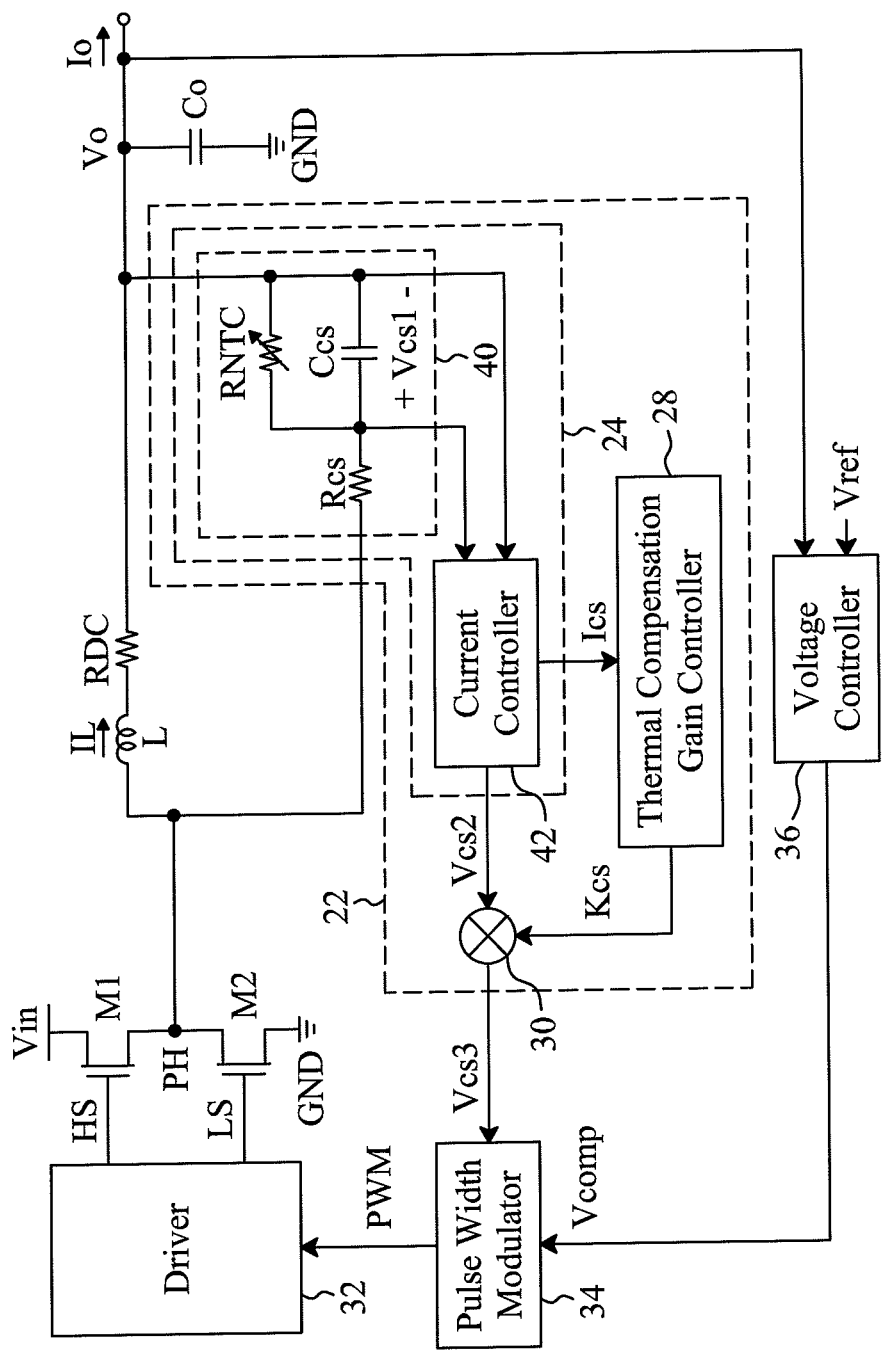
FIG. 5 is a circuit diagram of an embodiment according to the present invention applied in current-loop of a buck power converter to achieve thermal compensation of an intrinsic element.

FIG. 5 shows an embodiment of an adaptive thermal compensation method applied in current-loop of a buck power converter to achieve thermal compensation of an intrinsic element, in which a pulse width modulator 34 generates a switch signal PWM according to a voltage error signal Vcomp and an adaptive thermal compensated current sense signal Vcs3 for a driver 32 to switch power MOSFETs M1 and M2 to control an inductor current IL which charges an output capacitor Co to generate an output voltage V0, the resistor RDC represents the winding resistance of the inductor L, a voltage controller 36 senses the output voltage V0 to generate the voltage error signal Vcomp for the pulse width modulator 34, and an adaptive thermal compensation circuit 22 including a thermal sensor circuit 24, a thermal compensation gain controller 28 and an operation circuit 30, senses the external environment temperature of the inductor IL and predicts the temperature variation of the inductor L caused by power loss to generate the current sense signal Vcs3 for the buck power converter to generate precise output voltage V0 and inductor current IL. In the adaptive thermal compensation circuit 22, the thermal sensor circuit 24 senses the inductor current IL from the inductor L to generate a current sense signal Vcs2, and adjusts the current sense signal Vcs2 according to the external environment temperature of the inductor L. In this embodiment, since the thermal sensor circuit 24 senses the inductor current IL, it can take the place of the current sensor 26 shown in FIG. 4 to provide the current sense signal Ics to the thermal compensation gain controller 28. The current sense signal Ics may be equal to the current sense signal Vcs2. According to the current sense signal Ics, the thermal compensation gain controller 28 predicts the temperature variation of the inductor L caused by power loss to determine the thermal compensation value Kcs. The operation circuit 30 compensates the adjusted current sense signal Vcs2 with the thermal compensation value Kcs to generate the current sense signal Vcs3. In the thermal sensor circuit 24, an NTC thermistor RNTC, a current sense resistor Rcs and a current sense capacitor Ccs establish a current sense circuit 40 to sense the inductor current IL to generate the current sense signal Vcs1. When the external environment temperature of the inductor L varies, the resistance of the NTC thermistor RNTC varies accordingly, thereby providing the sensed external environment temperature value VT for adjusting the current sense signal Vcs1, and a current controller 42 generates the current sense signals Vcs2 and Ics according to the adjusted current sense signal Vcs1.

Figure 6:
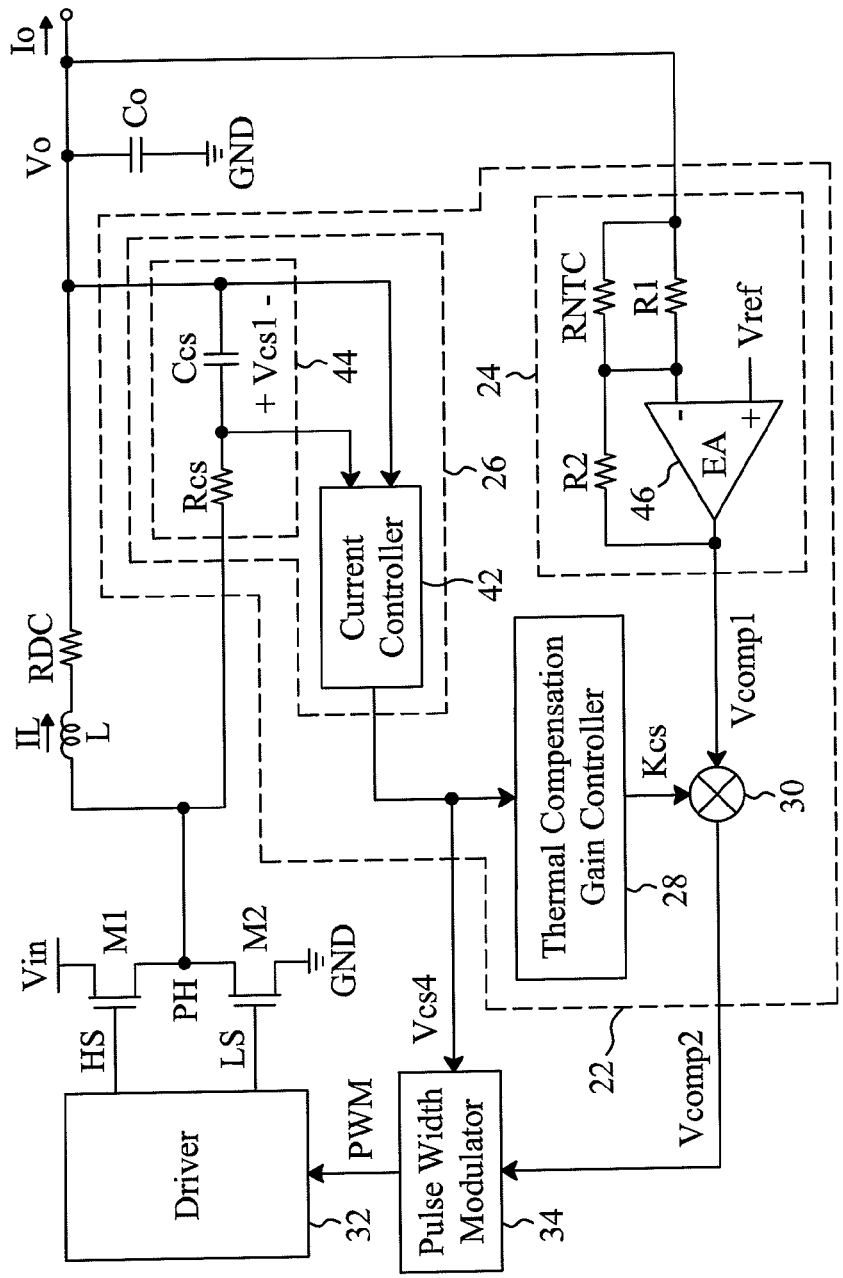
FIG. 6 is a circuit diagram of an embodiment according to the present invention applied in voltage-loop of a buck power converter to achieve thermal compensation of an intrinsic element.

FIG. 6 shows an embodiment of an adaptive thermal compensation method applied in voltage-loop of a buck power converter to achieve thermal compensation of an intrinsic element, in which the power MOSFETs M1 and M2, the inductor L, the driver 32 and the pulse width modulator 34 are the same as that shown in FIG. 5, and an adaptive thermal compensation circuit 22 senses the inductor current IL and the output voltage V0 to generate a current sense signal Vcs4 without thermal compensation and a voltage error signal Vcomp2 with adaptive thermal compensation. The pulse width modulator 34 generates the switch signal PWM according to the current sense signal Vcs4 and the voltage error signal Vcomp2 for the driver 32, thereby making the buck power converter to generate precise output voltage V0 and inductor current IL. In the adaptive thermal compensation circuit 22, the current sensor 26 has no thermal compensation and senses the inductor current It to generate the current sense signal Vcs4, the thermal compensation gain controller 28 generates a thermal compensation value Kcs according to the current sense signal Vcs4, the thermal sensor circuit 24 senses the output voltage V0 to generate a voltage error signal Vcomp1 and senses the external environment temperature of the inductor L to generate a sensed external environment temperature value for adjusting the voltage error signal Vcomp 1 in the same time, and the operation circuit 30 compensates the adjusted voltage error signal Vcomp 1 with the thermal compensation value Kcs to generate the voltage error signal Vcomp2. In the current sensor 26, a current sense resistor Rcs and a current sense capacitor Ccs establish a current sense circuit 44 to sense the inductor current IL to generate the current sense signal Vcs1 for the current controller 42 to generate the current sense signal Vcs4. In the thermal sensor circuit 24, an error amplifier 46 has a positive input terminal to receive a reference voltage Vref, a resistor R1 is connected between a negative input terminal of the error amplifier 46 and the output terminal Vo of the buck power converter, a resistor R2 is connected between the negative input terminal and the output terminal of the error amplifier 46, and an NTC thermistor RNTC is shunt to the resistor R1 and senses the external environment temperature of the inductor L to provide the sensed external environment temperature value for adjusting the voltage error signal Vcomp1.

Figure 7:
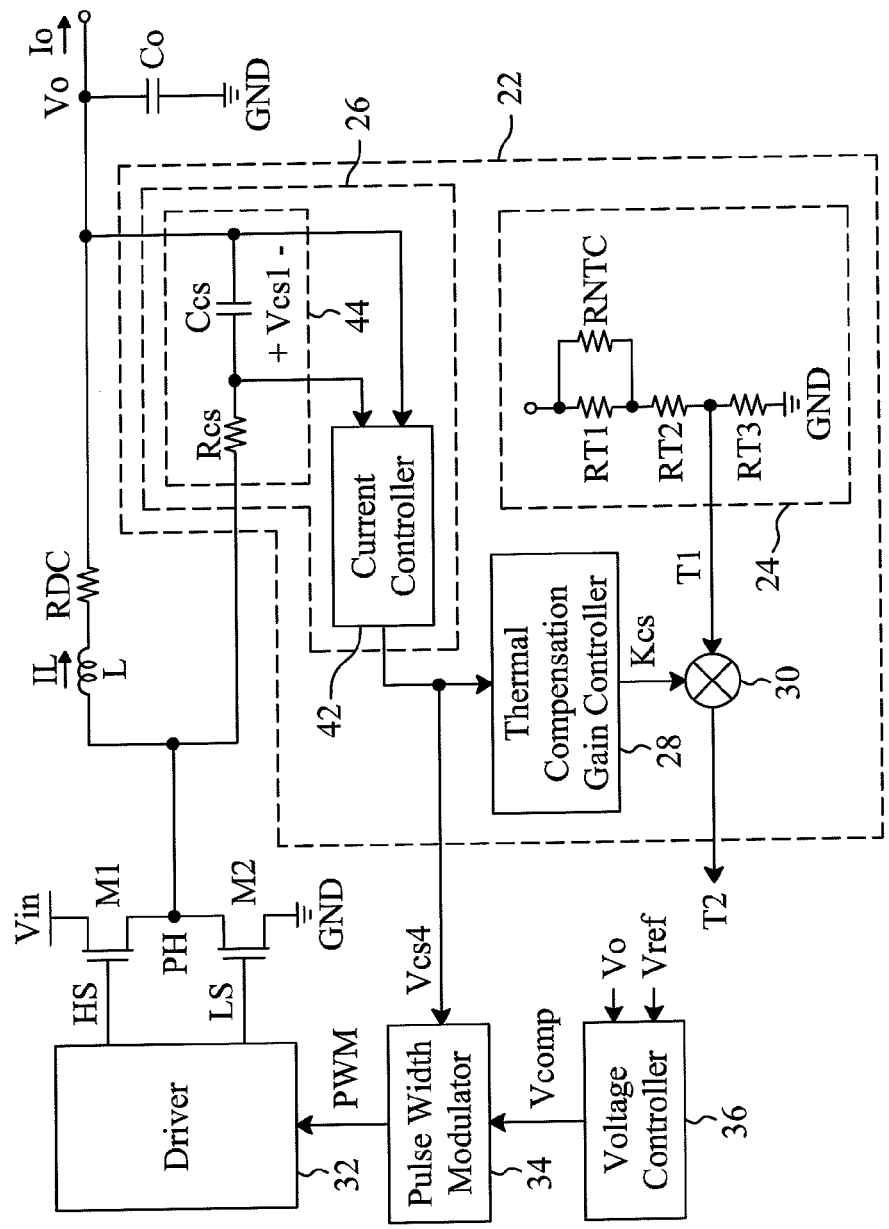
FIG. 7 is a circuit diagram of an embodiment according to the present invention applied in element temperature sensing loop of a buck power converter to achieve thermal compensation of an intrinsic element.

FIG. 7 shows an embodiment of an adaptive thermal compensation method applied in element temperature sensing loop of a buck power converter to achieve thermal compensation of an intrinsic element, in which the power MOSFETs M1 and M2, the inductor L, the driver 32 and the pulse width modulator 34 are the same as that shown in FIG. 5, and an adaptive thermal compensation circuit 22 provides a current sense signal Vcs4 without thermal compensation and a precise adaptive sensed temperature value T2. The adaptive sensed temperature value T2 may be used for thermal compensation of the current sense signal Vcs4 or the voltage error signal Vcomp, or any other suitable circuit such as over temperature protection (OTP) circuit to determine a temperature. In the adaptive thermal compensation circuit 22, the current sensor 26 includes a current sense circuit 44 to sense the inductor current IL to generate a current sense signal Vcs1, and a current controller 42 to generate the current sense signal Vcs4 according to the current sense signal Vcs1, the thermal compensation gain controller 28 generates the thermal compensation value Kcs according to the current sense signal Vcs4, the thermal sensor circuit 24 uses an NTC thermistor RNTC to sense the external environment temperature of the inductor L to generate the sensed external environment temperature value T1, and the operation circuit 30 generates the adaptive sensed temperature value T2 according to the sensed external environment temperature value T1 and the thermal compensation value Kcs.

Referring to FIGS. 5-7, in each adaptive thermal compensation circuit 22, except for the thermal compensation gain controller 28, the thermal sensor circuit 24 and the current sensor 26 are the circuits that conventional thermal compensation methods have used, and thus the adaptive thermal compensation circuit 22 according to the present invention has almost the same costs as that of conventional circuits for thermal compensation.

In FIGS. 5-7, each adaptive thermal compensation circuit 22 senses the inductor current IL and the external environment temperature of the inductor L. However, in other embodiments, the adaptive thermal compensation circuit 22 according to the present invention may be used to sense the current and the external environment temperature of other power components, such as the power MOSFETs M1 and M2.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An adaptive thermal compensation circuit for an intrinsic element in a system, comprising:
   a thermal sensor circuit operative to sense an external environment temperature of the intrinsic element to generate a sensed external environment temperature value;
   a current sensor sensing a current of the intrinsic element to generate a current sense signal; and
   a thermal compensation gain controller connected to the current sensor, responsive to the current sense signal to predict a temperature variation of the intrinsic element caused by power loss to generate a thermal compensation value for adjusting the sensed external environment temperature value to generate an adaptive sensed temperature value,
   wherein the thermal compensation gain controller searches a look-up table according to the current sense signal to determine the thermal compensation value.

2. The adaptive thermal compensation circuit of claim 1, wherein the thermal sensor circuit comprises a thermistor.

3. An adaptive thermal compensation method for an intrinsic element in a system, comprising steps of:

A.) sensing an external environment temperature of the intrinsic element to generate a sensed external environment temperature value;
B.) sensing a current of the intrinsic element to generate a current sense signal;
C.) predicting a temperature variation of the intrinsic element caused by power loss according to the current sense signal, to generate a thermal compensation value; and
D.) adjusting the sensed external environment temperature value according to the thermal compensation value to generate an adaptive sensed temperature value,
wherein the step C comprises a step of searching a look-up table to determine the thermal compensation value according to the current sense signal.

4. An adaptive thermal compensation circuit for an intrinsic element in a system, comprising:
   a thermal sensor circuit operative to sense a current of the intrinsic element to generate a first current sense signal and a second current sense signal, and to sense an external environment temperature of the intrinsic element to generate a sensed external environment temperature value for adjusting the first and second current sense signals; and
   a thermal compensation gain controller connected to the thermal sensor circuit, responsive to the adjusted second current sense signal to generate a thermal compensation value for compensating the adjusted first current sense signal to generate an adaptive thermal compensated signal,
   wherein the thermal compensation gain controller searches a look-up table according to the adjusted second current sense signal to determine the thermal compensation value.

5. The adaptive thermal compensation circuit of claim 4, wherein the thermal sensor circuit comprises a thermistor.

6. The adaptive thermal compensation circuit of claim 4, wherein the first current sense signal is equal to the second current sense signal.

7. An adaptive thermal compensation method for an intrinsic element in a system, comprising steps of:
   A.) sensing a current of the intrinsic element to generate a first current sense signal and a second current sense signal;
   B.) sensing an external environment temperature of the intrinsic element to generate a sensed external environment temperature value for adjusting the first and second current sense signals;
   C.) generating a thermal compensation value according to the adjusted second current sense signal; and
   D.) compensating the adjusted first current sense signal according to the thermal compensation value to generate an adaptive thermal compensated signal,
   wherein the step C comprises a step of searching a look-up table according to the adjusted second current sense signal to determine the thermal compensation value.

8. The adaptive thermal compensation method of claim 7, wherein the first current sense signal is equal to the second current sense signal.

* * * * *